US009781823B2

United States Patent
Lyon et al.

(10) Patent No.: US 9,781,823 B2
(45) Date of Patent: Oct. 3, 2017

(54) TRACE BORDER ROUTING

(71) Applicant: Apple Inc., Cupertino, CA (US)

(72) Inventors: Benjamin B. Lyon, San Jose, CA (US); Shih-Chang Chang, Cupertino, CA (US); Martin Paul Grunthaner, Los Altos Hills, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/273,110

(22) Filed: Sep. 22, 2016

(65) Prior Publication Data

US 2017/0013707 A1     Jan. 12, 2017

Related U.S. Application Data

(63) Continuation of application No. 13/007,493, filed on Jan. 14, 2011, now Pat. No. 9,491,852.

(Continued)

(51) Int. Cl.
*G06F 3/045* (2006.01)
*H05K 1/02* (2006.01)
(Continued)

(52) U.S. Cl.
CPC ......... *H05K 1/0242* (2013.01); *G06F 3/0412* (2013.01); *G06F 3/0416* (2013.01);
(Continued)

(58) Field of Classification Search
CPC . G02F 1/13452; G02F 1/13338; G02F 1/1345
(Continued)

(56) References Cited

U.S. PATENT DOCUMENTS 3,773,989 A    11/1973   Hacon
5,062,916 A    11/1991   Aufderheide et al.
(Continued)

FOREIGN PATENT DOCUMENTS

CN       1902538 A     1/2007
CN     101059737 A    10/2007
(Continued)

OTHER PUBLICATIONS

Chinese Search Report dated May 6, 2015, for CN Patent Application No. 201210581912.3, filed Jun. 1, 2009, four pages.
(Continued)

*Primary Examiner* — Calvin C Ma
(74) *Attorney, Agent, or Firm* — Morrison & Foerster LLP

(57) ABSTRACT

The border routing of conductive traces in devices, such as displays, touch sensor panels, and touch screens, to improve border area space usage, thereby reducing device size, and to reduce trace resistance, thereby improving device operation, is disclosed. The conductive traces can form a staggered stair-step configuration in the device border area, in which the average widths of the traces can be different from each other and each trace can have segments with different widths. The conductive traces can be coupled to an active area of the device to transmit signals to and from the active area in accordance with a device operation. The varying widths can help improve the border area space usage, reduce trace resistance, and reduce the differences in resistance between traces.

20 Claims, 7 Drawing Sheets

Related U.S. Application Data

(60) Provisional application No. 61/393,818, filed on Oct. 15, 2010.

(51) Int. Cl.
*G06F 3/041* (2006.01)
*G09G 3/20* (2006.01)

(52) U.S. Cl.
CPC . *H05K 1/0265* (2013.01); *G06F 2203/04108* (2013.01); *G09G 3/2092* (2013.01); *H05K 2201/0784* (2013.01); *H05K 2201/09272* (2013.01); *H05K 2201/09727* (2013.01); *Y10T 29/49155* (2015.01)

(58) Field of Classification Search
USPC .................................. 345/173, 174; 29/846
See application file for complete search history.

(56) References Cited

U.S. PATENT DOCUMENTS

| | | | |
|---|---|---|---|
| 5,239,152 A | 8/1993 | Caldwell et al. | |
| 5,483,261 A | 1/1996 | Yasutake | |
| 5,488,204 A | 1/1996 | Mead et al. | |
| 5,825,352 A | 10/1998 | Bisset et al. | |
| 5,835,079 A | 11/1998 | Shieh | |
| 5,869,791 A | 2/1999 | Young | |
| 5,880,411 A | 3/1999 | Gillespie et al. | |
| 5,914,763 A * | 6/1999 | Fujii | G02F 1/1345 349/143 |
| 5,994,766 A | 11/1999 | Shenoy et al. | |
| 6,066,916 A * | 5/2000 | Osada | H05B 33/26 313/504 |
| 6,188,391 B1 | 2/2001 | Seely et al. | |
| 6,297,811 B1 | 10/2001 | Kent et al. | |
| 6,310,610 B1 | 10/2001 | Beaton et al. | |
| 6,323,846 B1 | 11/2001 | Westerman et al. | |
| 6,690,387 B2 | 2/2004 | Zimmerman et al. | |
| 7,015,894 B2 | 3/2006 | Morohoshi | |
| 7,075,505 B2 | 7/2006 | Sakaguchi et al. | |
| 7,117,464 B2 | 10/2006 | Frank et al. | |
| 7,184,064 B2 | 2/2007 | Zimmerman et al. | |
| 7,321,362 B2 | 1/2008 | Bottari et al. | |
| 7,339,579 B2 | 3/2008 | Richter | |
| 7,423,621 B2 | 9/2008 | Lin et al. | |
| 7,663,607 B2 | 2/2010 | Hotelling et al. | |
| 7,705,952 B2 | 4/2010 | Lee et al. | |
| 7,755,176 B1 | 7/2010 | St. Amand et al. | |
| 8,179,353 B2 | 5/2012 | Imajo et al. | |
| 8,194,044 B2 | 6/2012 | Richter | |
| 8,255,830 B2 | 8/2012 | Ording et al. | |
| 8,479,122 B2 | 7/2013 | Hotelling et al. | |
| 9,069,418 B2 | 6/2015 | Grunthaner et al. | |
| 9,495,048 B2 | 11/2016 | Grunthaner et al. | |
| 2003/0134095 A1 | 7/2003 | Bottari et al. | |
| 2004/0149377 A1 | 8/2004 | Bottari et al. | |
| 2005/0126831 A1 | 6/2005 | Richter | |
| 2006/0087379 A1 | 4/2006 | Bartley et al. | |
| 2006/0189123 A1 | 8/2006 | Saitou et al. | |
| 2006/0197753 A1 | 9/2006 | Hotelling | |
| 2007/0115263 A1 | 5/2007 | Taylor et al. | |
| 2007/0120471 A1 | 5/2007 | Yamazaki et al. | |
| 2007/0222763 A1 | 9/2007 | Spath | |
| 2007/0271399 A1 | 11/2007 | Peng et al. | |
| 2008/0100592 A1 | 5/2008 | Shigeno et al. | |
| 2008/0117182 A1 | 5/2008 | Um et al. | |
| 2008/0143683 A1 | 6/2008 | Hotelling | |
| 2008/0158181 A1 | 7/2008 | Hamblin et al. | |
| 2008/0165158 A1 | 7/2008 | Hotelling et al. | |
| 2008/0309633 A1 | 12/2008 | Hotelling et al. | |
| 2009/0091551 A1 | 4/2009 | Hotelling et al. | |
| 2009/0107736 A1 | 4/2009 | Ben-Eliyahu | |
| 2009/0143141 A1 | 6/2009 | Wells et al. | |
| 2009/0153509 A1 | 6/2009 | Jiang et al. | |
| 2009/0219258 A1 | 9/2009 | Geaghan et al. | |
| 2009/0266621 A1 | 10/2009 | Huang et al. | |
| 2009/0303189 A1 * | 12/2009 | Grunthaner | G06F 3/044 345/173 |
| 2009/0314621 A1 | 12/2009 | Hotelling | |
| 2010/0013800 A1 | 1/2010 | Elias et al. | |
| 2010/0079384 A1 | 4/2010 | Grivna | |
| 2010/0166287 A1 | 7/2010 | Ramer et al. | |
| 2011/0074705 A1 | 3/2011 | Yousefpor et al. | |
| 2011/0163764 A1 | 7/2011 | Shank et al. | |
| 2011/0298731 A1 | 12/2011 | Fu et al. | |
| 2013/0038572 A1 | 2/2013 | Frey et al. | |
| 2014/0139763 A1 | 5/2014 | Grunthaner et al. | |
| 2017/0010722 A1 | 1/2017 | Grunthaner et al. | |

FOREIGN PATENT DOCUMENTS

| | | |
|---|---|---|
| CN | 101162418 A | 4/2008 |
| JP | 03-015433 A | 2/1991 |
| JP | 2000-163031 A | 6/2000 |
| JP | 2002-342033 A | 11/2002 |
| JP | 2004-296297 A | 10/2004 |
| JP | 2008-009920 A | 1/2008 |
| KR | 20020011716 A | 2/2002 |
| NL | WO2005073791 A1 * | 8/2005 |
| WO | WO-96/18179 A1 | 6/1996 |
| WO | WO-2005/073791 A1 | 8/2005 |
| WO | WO-2005/114369 A2 | 12/2005 |
| WO | WO-2005/114369 A3 | 12/2005 |
| WO | WO-2007/008518 A1 | 1/2007 |
| WO | WO-2009/149014 A1 | 12/2009 |

OTHER PUBLICATIONS

Chinese Search Report dated Sep. 6, 2016, for CN Patent Application No. 201210581912.3, filed Jun. 1, 2009, with English translation, four pages.

European Search Report dated Apr. 19, 2012, for EP Patent Application No. 12158277.9, four pages.

European Search Report dated Feb. 4, 2013, for EP Patent Application No. 12195666.8, five pages.

European Search Report dated Oct. 28, 2014, for EP Patent Application No. 14168254.2, three pages.

Final Office Action dated Apr. 19, 2012, for U.S. Appl. No. 12/135,038, filed Jun. 6, 2008, eight pages.

Final Office Action dated Nov. 6, 2013, for U.S. Appl. No. 12/135,038, filed Jun. 6, 2008, 14 pages.

Final Office Action dated Jul. 3, 2014, for U.S. Appl. No. 13/007,493, filed Jan. 14, 2011, 19 pages.

Final Office Action dated Jul. 2, 2015, for U.S. Appl. No. 13/007,493, filed Jan. 14, 2011, 22 pages.

Final Office Action dated Jan. 14, 2016, for U.S. Appl. No. 14/163,899, filed Jan. 24, 2014, 17 pages.

International Search Report dated Jul. 23, 2009, for PCT Patent Application No. PCT/US2009/045843, filed Jun. 1, 2009, two pages.

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

Non-Final Office Action dated Sep. 29, 2011, for U.S. Appl. No. 12/135,038, filed Jun. 6, 2008, seven pages.

Non-Final Office Action dated Jun. 19, 2013, for U.S. Appl. No. 12/135,038, filed Jun. 6, 2008, 9 pages.

Non-Final Office Action dated Dec. 16, 2013, for U.S. Appl. No. 13/007,493, filed Jan. 14, 2011, 16 pages.

Non-Final Office Action dated Sep. 17, 2014, for U.S. Appl. No. 12/135,038, filed Jun. 6, 2008, seven pages.

Non-Final Office Action dated Jan. 16, 2015, for U.S. Appl. No. 13/007,493, filed Jan. 14, 2011, 21 pages.

Non-Final Office Action dated May 6, 2015, for U.S. Appl. No. 14/163,899, filed Jan. 24, 2014, 14 pages.

Non-Final Office Action dated Jan. 4, 2016, for U.S. Appl. No. 13/007,493, filed Jan. 14, 2011, 20 pages.

(56) References Cited

OTHER PUBLICATIONS

Notice of Allowance dated Mar. 12, 2015, for U.S. Appl. No. 12/135,038, filed Jun. 6, 2008, ten pages.
Notice of Allowance dated Aug. 12, 2016, for U.S. Appl. No. 14/163,899, filed Jan. 24, 2014, ten pages.
Notice of Allowance dated Aug. 26, 2016, for U.S. Appl. No. 13/007,493, filed Jan. 14, 2011, eight pages.
Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.
Rubine, D.H. (May 1992). "Combining Gestures and Direct Manipulation," CHI '92, pp. 659-660.
Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

* cited by examiner

TRACE BORDER ROUTING

CROSS REFERENCES TO RELATED APPLICATIONS

This application is a continuation of U.S. patent application Ser. No. 13/007,493, filed Jan. 14, 2011 and published as U.S. Patent Publication No. 2012-0092273 on Apr. 19, 2012, which claims the benefit of U.S. Provisional Application No. 61/393,818, filed Oct. 15, 2010, the disclosures of which are herein incorporated by reference in their entirety for all intended purposes.

FIELD

This relates generally to conductive traces and more particularly to improved routing of conductive traces in a border area of a device.

BACKGROUND

Many types of devices are presently available for performing operations in a computing system, such as displays, touch sensor panels, and touch screens. Displays can display graphics and/or text information to a user. Touch sensor panels can sense an object, e.g., the user's hand, touching or hovering over the panel, causing the computing system to perform some operation based on the touch or hover. Touch screens can include both a display and a touch sensor panel and can allow a user to perform various functions by touching or hovering over the touch sensor panel at a location dictated by a user interface (UI) being displayed by the display, causing the computing system to perform some operation based on the touch or hover and in accordance with the graphics and/or text information appearing at the time of the touch or hover.

Portable computing systems are becoming increasingly popular because of their ease and versatility of operation, mobility, and declining price. As such, it is desirable to produce a smaller, thinner system, while maintaining easy and versatile operation.

SUMMARY

This relates to border routing of conductive traces in devices, such as displays, touch sensor panels, and touch screens, to improve border area space usage, thereby reducing device size, and to reduce trace resistance, thereby improving device operation. The conductive traces can form a staggered stair-step configuration in which the average widths of the traces can be different from each other and each trace can have segments with different widths. The conductive traces can be coupled to an active area of the device to transmit signals to and from the active area in accordance with an operation of the device. The varying widths can help improve the border area space usage, reduce trace resistance, and reduce the differences in resistance between traces. This border routing can advantageously provide smaller border areas and improved device performance.

DETAILED DESCRIPTION

In the following description of example embodiments, reference is made to the accompanying drawings in which it is shown by way of illustration specific embodiments that can be practiced. It is to be understood that other embodiments can be used and structural changes can be made without departing from the scope of the various embodiments.

This relates to border routing of conductive traces in devices, such as displays, touch sensor panels, and touch screens, to optimize or otherwise improve border area space usage, thereby reducing device size, and to minimize or otherwise reduce trace resistance, thereby improving device operation. The conductive traces can form a staggered stair-step configuration in which the average widths of the traces can be different from each other and each trace can have segments with different widths. The conductive traces can be coupled to an active area of the device to transmit signals to and from the active area in accordance with a device operation. The varying widths can help optimize or improve the border area space usage, minimize or reduce trace resistance, and minimize or reduce the differences in resistance between traces. This border routing can advantageously provide smaller border areas and improved device performance.

Figure 1:
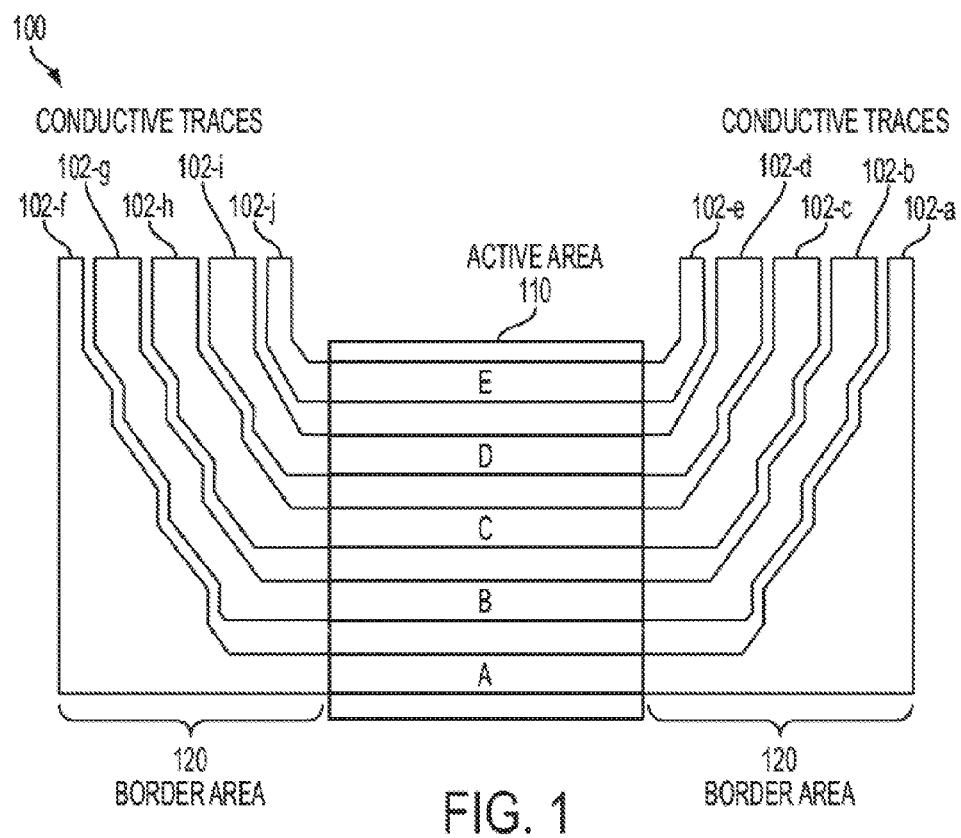
FIG. 1 illustrates an exemplary device having border routing of conductive traces according to various embodiments.

FIG. 1 illustrates an exemplary device having border routing of conductive traces according to various embodiments. In the example of FIG. 1, electronic device 100 can include active area 110 for performing an operation of the device and border area 120 for routing conductive traces 102 between the active area and signal processing circuitry (not shown). The conductive traces 102 can transmit electrical signals to and from the active area 110 in association with the performing operation. Each conductive trace 102 can be coupled to a particular location of the active area 110 and routed in the border area 120 from that location to the signal processing circuitry. For example, conductive traces 102-*a*, 102-*f* can be coupled to location A of the active area 110 to transmit signals to and from this location and can be routed in the border area 120 to the signal processing circuitry, which is disposed above location E in this example. Conductive traces 102-*b*, 102-*g* can be coupled to location B of the active area 110 to transmit signals to and from this location and can be in the border area 120 from this location up to the signal processing circuitry. Conductive traces 102-*c*, 102-*h* can be coupled to location C of the active area 110 to transmit signals to and from this location and can be routed in the border area 120 from this location up to the signal processing circuitry. Conductive traces 102-*d*, 102-*i* can be coupled to location D of the active area 110 to transmit signals to and from this location and can be routed in the border area 120 from this location up to the signal processing circuitry. Conductive traces 102-*e*, 102-*j* can be coupled to location E of the active area 110 to transmit signals to and from this location and can be routed in the border area 120 from this location up to the signal processing circuitry.

Trace resistance can be a function of trace width. Generally, the wider the conductive trace, the lower the resistance. In this example, each trace can be formed to have segments with various widths to reduce the trace's resistance. Trace resistance can also be a function of trace length. Generally, the longer the conductive trace, the higher the resistance. In this example, conductive traces 102-*a*, 102-*f* are the longest traces, conductive traces 102-*e*, 102-*j* are the shortest traces, and the other conductive traces have lengths therebetween. Since different trace lengths can result in different resistances and hence different transmission rates (among other undesirable conditions), the widths of the conductive traces 102 can be formed to substantially reduce or eliminate the differences in resistance between the traces. In this example, the segment widths in each trace can be formed to be different from the segment widths in another trace based on how much resistance difference needs to be reduced or eliminated. The trace widths can also be formed to make optimal use of the width of the border area 120 in accordance with the number of traces present at any location along the length of the border area. Accordingly, the trace widths can be formed to reduce the trace's resistance, minimize resistance differences between traces, and optimize border area space for the traces and any other electrical requirements.

As such, looking at the right-side border area 120, at location A where only one conductive trace 102-*a* is present, the trace width can be formed to essentially fill the border area space and reduce the trace's resistance. At location B, two conductive traces 102-*a*, 102-*b* are present, so the widths of the two traces can be formed to optimize border area space between the two traces while reducing each trace's resistance and resistance differences between the traces. At location C, three conductive traces 102-*a*, 102-*b*, 102-*c* are present, so the widths of the three traces can be formed to optimize border area space between the three traces and to reduce each trace's resistance and resistance differences between the traces. At location D where four conductive traces 102-*a*, 102-*b*, 102-*c*, 102-*d* are present, the trace widths can be formed to optimize border area space between the four traces and to reduce each trace's resistance and resistance differences between the traces. At location E, all five conductive traces 102-*a*, 102-*b*, 102-*c*, 102-*d*, 102-*e* are present, so the widths can be formed to optimize border area space between the five traces and to reduce each trace's resistance and resistance differences between the traces. The result can be a staggered stair-step configuration of the conductive traces 102.

In this stair-step configuration example of FIG. 1, conductive trace 102-*a* can have five segments (one at each location A through E) in which one or more of the segments have different widths. For example, the width at location A can be widest, the width at adjacent location B can be somewhat narrower, the width at adjacent location C can be even narrower, the width at adjacent location D can be narrower still, and the width at adjacent location E can be narrowest, resulting in a stair-step configuration for trace 102-*a*. Conductive trace 102-*b* can have four segments (one at each location B through E) in which one or more of the segments have different widths, resulting in its stair-step configuration. Conductive trace 102-*c* can have three segments (one at each location C through E) in which one or more of the segments have different widths, forming its stair-step configuration. Conductive trace 102-*d* can have two segments (one at each location D and E) in which the two segments can have different widths in the stair-step configuration. The same configuration can be applicable for conductive traces 102-*f* through 102-*j*.

Moreover, in this stair-step configuration example of FIG. 1, at location B, the widths of the segments for conductive traces 102-*b*, 102-*a* can be different. At location C, one or more of the widths of the segments for conductive traces 102-*c*, 102-*b*, 102-*c* can be different. At location D, one or more of the widths of the segments for conductive traces 102-*d*, 102-*c*, 102-*b*, 102-*a* can be different. At location E, one or more of the widths of the segments for conductive traces 102-*e*, 102-*d*, 102-*c*, 102-*b*, 102-*a* can be different. The same configuration can be applicable for conductive traces 102-*f* through 102-*j*.

As a result, in some embodiments, the average widths (i.e., the average of the segment widths) of each trace 102 on one side of the border area 120 can be different. Whereas, each pair of conductive traces 102 coupled to the same location on opposite sides of active area 110 can have the same or similar average width. Additionally, each pair can have the same or similar corresponding individual segment widths.

For the conductive traces that span multiple locations, e.g., traces 102-*a*, 102-*b*, 102-*c*, 102-*d*, 102-*f*, 102-*g*, 102-*h*, 102-*i*, the widths of the trace segments at all the other locations can be taken into account when setting a segment width at a particular location to ensure that the trace's resistance is reduced to an optimal or preferable level. For example, conductive trace 102-*a* spans all five locations A through E. As such, to ensure that the trace's resistance is reduced to an optimal or preferable level, when determining the segment width at location E, the previously determined segment widths at locations A through D can be used to assess what segment width at location E would result in the optimal or preferred resistance.

Determining appropriate trace segment widths to be formed at each location can be an iterative process, particularly when there are multiple electrical requirements to be met, e.g., to minimize a trace's resistance, while minimizing resistance differences between traces, while optimizing border area space. As such, there can be tradeoffs between how low the trace resistance can be, how many of the traces can have matching or near matching resistances, and how little of the border area space can be used. Ideally, a goal can be to find the maximum resistance among the traces within the width constraints of the border area and then determine widths of the other traces to be at or below that resistance within the width constraints of the border area. In some embodiments, an optimization algorithm can be used to balance these (and any other) electrical requirements and calculate optimal or preferable segment widths for each trace at each location. These calculated trace segment widths can then be formed in the border areas of the device.

Optimizing the border area space does not necessarily require that all the border area be filled by the trace widths. Rather, in some embodiments, trace widths can be narrower than the border area optimum so as to avoid parasitic coupling with proximate components in the active area. Or in some embodiments, larger spacing between the active area and the traces can be made to avoid the parasitic coupling.

In this example of FIG. 1, the conductive traces 102 are shown in the border area 120 on both sides of the active area 110. However, it is to be understood that the conductive traces 102 can be in the border area on only one side of the active area 110. That way, electrical signals can be transmitted to and from the active area 110 on one side in associated with the performing operation.

Also, each active area location has a conductive trace coupled thereto. However, it is to be understood that other coupling are also possible. For example, the conductive traces 102 can be interleaved on both sides of the active area 110, such that some conductive traces 102 can couple at locations A, C, and E in the border area 120 on one side of the active area 110 and other conductive traces can couple at locations B and D in the border area on the other side of the active area. That way, more border space can be available for widening the traces. The interleaved conductive traces 102 on both sides can have the stair-step configuration and can form widths to reduce trace resistance and to optimize border area space, as previously described.

Figure 2:
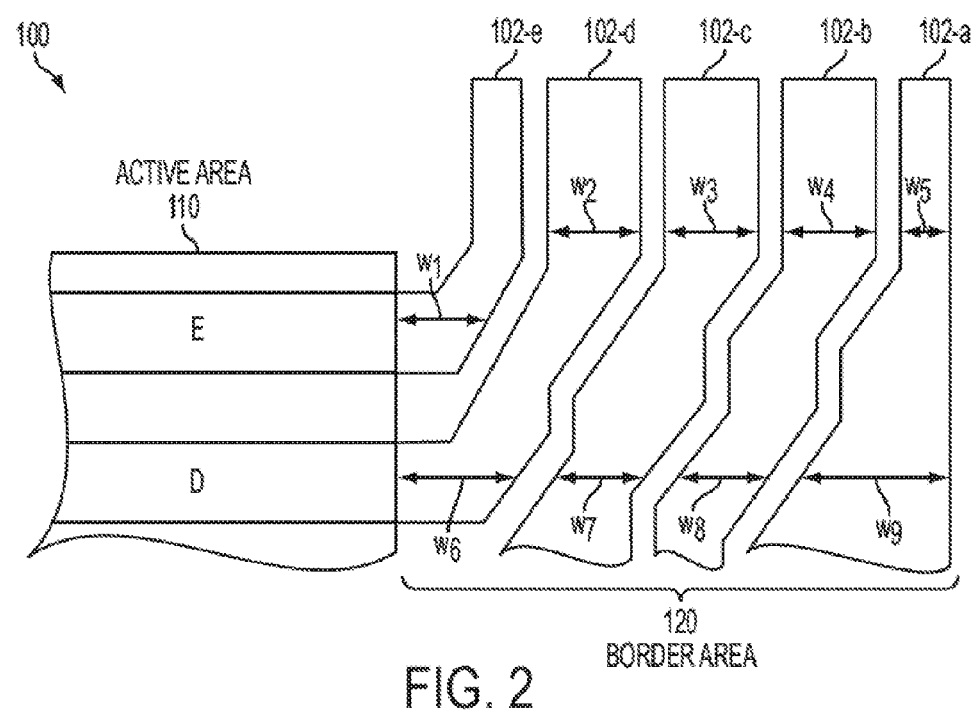
FIG. 2 illustrates an exemplary border routing of the conductive traces of FIG. 1 according to various embodiments.

FIG. 2 illustrates a close up view of the border routing of the conductive traces of FIG. 1 according to various embodiments. In the example of FIG. 2, at location E, the segment widths w1, w2, w3, w4, w5 (not drawn to scale) of the conductive traces 102 can be formed as previously described. In some embodiments, the widths can be different based on what's needed to reduce the trace's resistance. For example, the shortest trace 102-*e* can form a narrower width w1 to overcome a smaller trace resistance. The longest trace 102-*a* can also form a narrower width w5 because much of the trace's resistance reduction has been accounted for in the trace widths at other locations A-D. Whereas trace 102-*d* can have a wider width w2 than trace 102-*e* to overcome a larger trace resistance. In alternate embodiments, the widths can be the same. At location D, the segment widths w6, w7, w8, w9 (not drawn to scale) of the conductive traces 102 can also be formed as previously described. In some embodiments, the widths can be different based on what's needed to reduce the trace's resistance. In alternate embodiments, the widths can be the same. For those traces that span locations D and E, their widths in the two locations can be the same or different based on what's needed to reduce the trace's resistance. For example, trace 102-*d* can have either different or same widths w2, w6.

Figure 3:
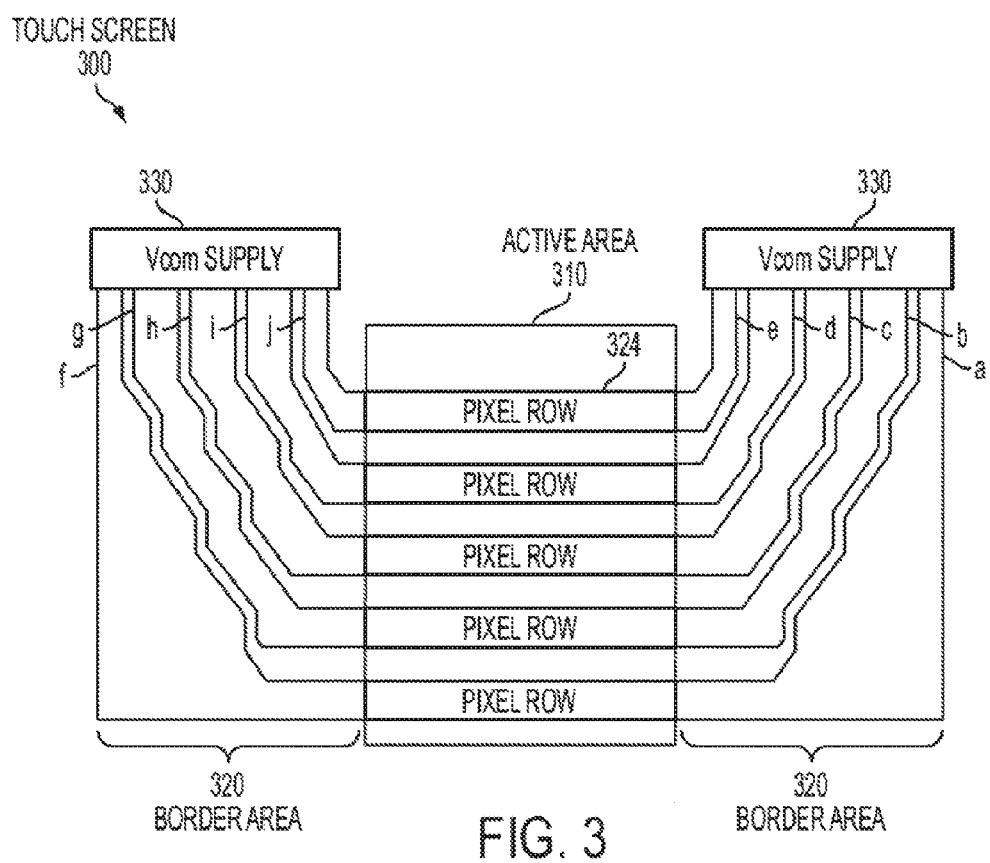
FIG. 3 illustrates an exemplary touch screen having border routing of common electrode voltage lines according to various embodiments.

FIGS. 3 through 7 illustrate exemplary devices having border routing of conductive traces according to various embodiments. In the example of FIG. 3, touch screen 300 can have border routing of common electrode voltage (Vcom) lines 302 for driving active area 310 according to various embodiments. The Vcom line 302 can have similar structures to conductive traces 102 of FIG. 1. The active area 310 of the touch screen 300 can include multiple rows 324 of integrated touch-display pixels. Each Vcom line 302 can transmit a voltage from Vcom supply 330 to a corresponding row 324 of pixels to stimulate the pixels to sense a touching or hovering object at the active area 310. As a consequence of reducing resistance in the border traces, this border routing can substantially reduce or eliminate crosstalk in sensed touch or hover signals in the touch screen 300 caused by stray display signals undesirably coupling with the Vcom lines 302 while sensing the touch or hover.

Figure 4:
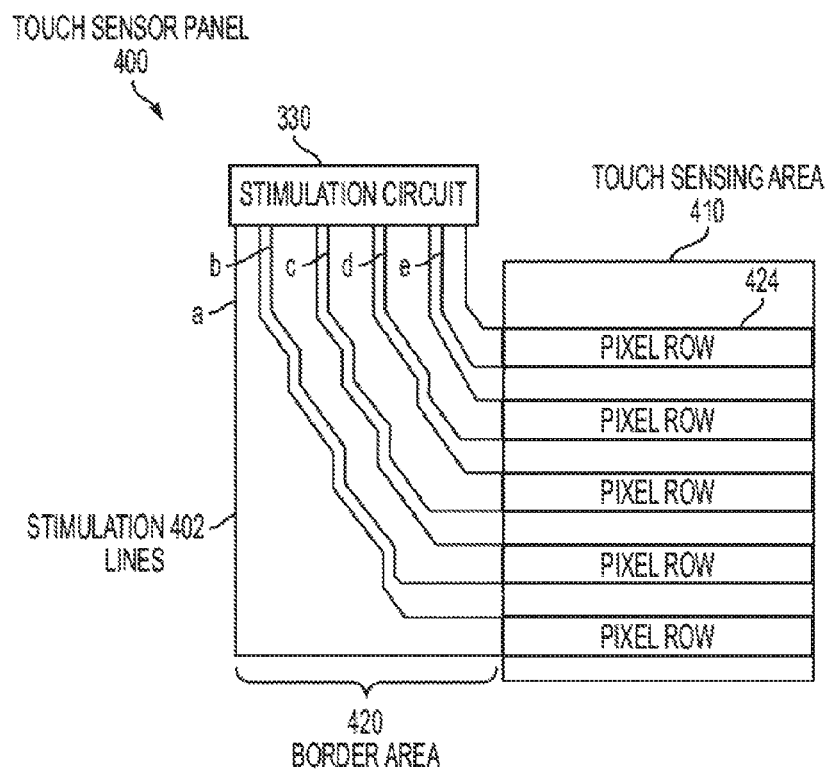
FIG. 4 illustrates an exemplary touch sensor panel having border routing of stimulation signal lines according to various embodiments.

In the example of FIG. 4, touch sensor panel 400 can have border routing of stimulation lines 402 for driving touch sensing area 410 according to various embodiments. The stimulation lines 402 can have similar structures to conductive traces 102 of FIG. 1. The touch sensing area 410 can include multiple rows 424 of touch pixels. Each stimulation line 402 can transmit a stimulation signal from stimulation circuitry 430 to a corresponding row 424 of touch pixels to stimulate the pixels to sense a touching or hovering object at the touch sensing area 410. Here, the stimulation lines 402 can form in the border area 420 on one side of the touch sensing area 410. This border routing can substantially reduce or eliminate undesirable parasitic capacitance and/or resistance that can adversely affect the sensed touch or hover signals.

In some embodiments, the touch sensor panel 400 can be disposed on a display to form a touch screen. The panel 400 can have similar border routing of the stimulation lines 402 to drive the panel. In addition to reducing capacitance and resistance, this border routing can also substantially reduce or eliminate crosstalk caused by the display in sensed touch or hover signals.

Figure 5:
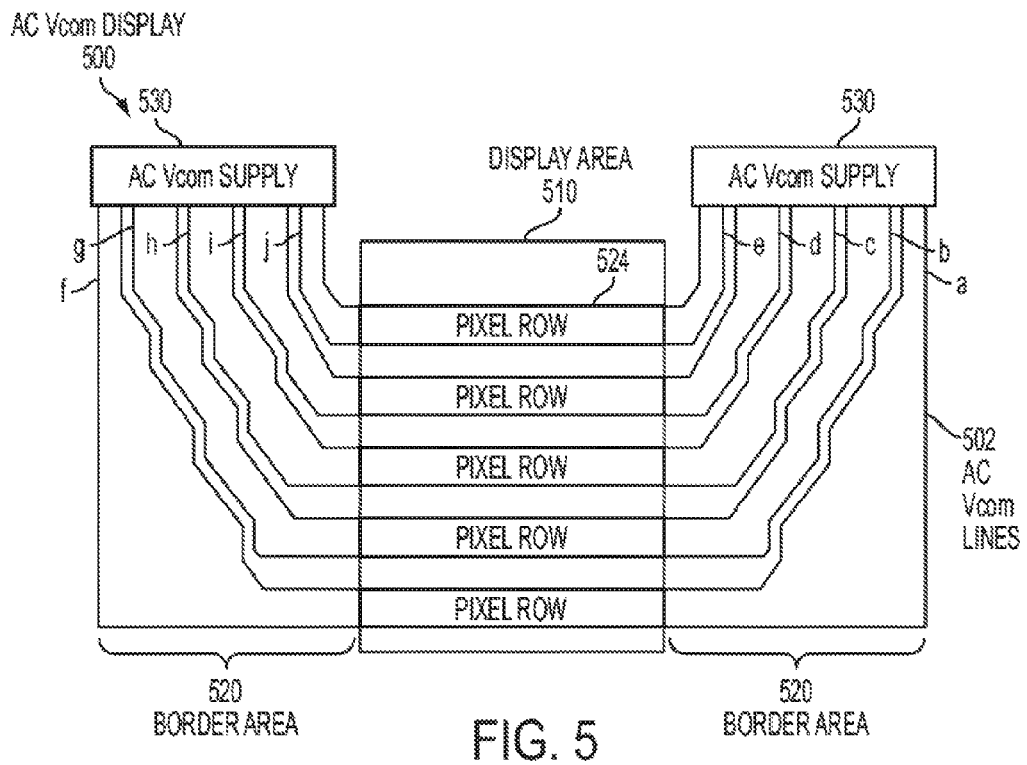
FIG. 5 illustrates an exemplary display having border routing of AC common electrode voltage lines according to various embodiments.

In the example of FIG. 5, display 500 can have border routing of AC driven Vcom lines 502 for driving display area 510 according to various embodiments. The AC Vcom lines 502 can have similar structures to conductive traces 102 of FIG. 1. The display area 510 can include multiple rows 524 of display pixels. Each AC Vcom line 502 can transmit an AC voltage from Vcom supply 530 to drive the pixels to display graphics and/or text information. This border routing can effectively replace a thick conductive trace surrounding the display area in traditional AC Vcom displays used to ensure that the applied voltage is uniform across the display area. As a result, the border routing can optimize border area space as well as ensure the uniformity of the applied voltage.

Figure 6:
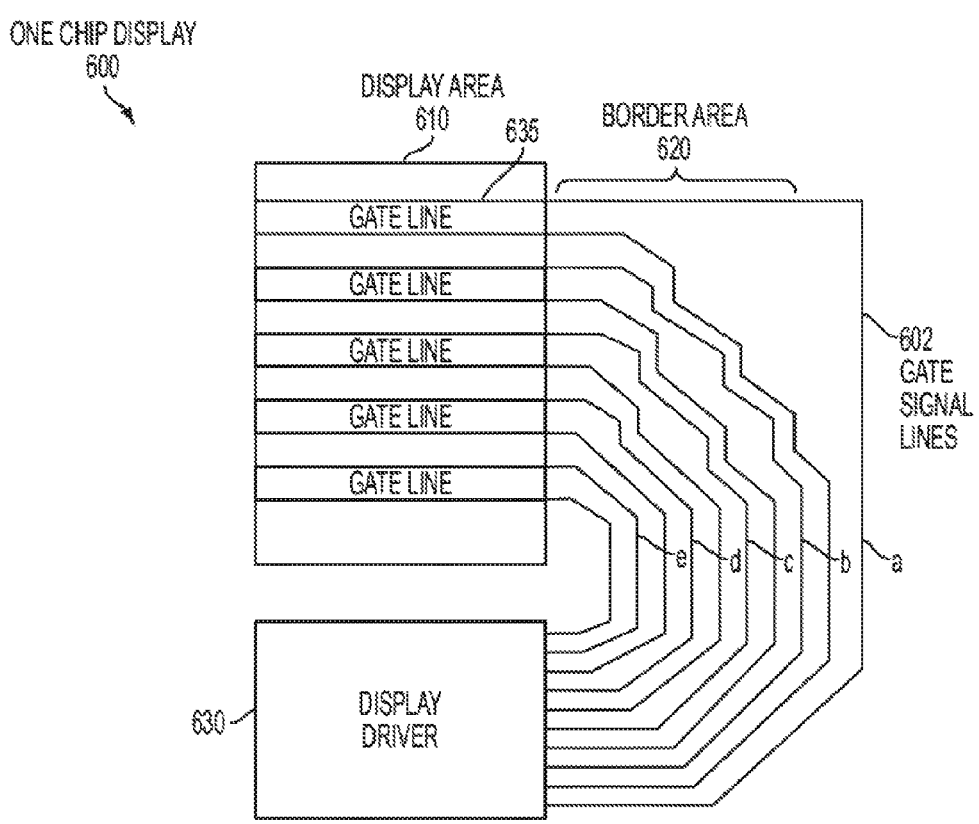
FIG. 6 illustrates an exemplary one chip display having border routing of gate signal lines according to various embodiments.

In the example of FIG. 6, one chip display 600 can have border routing of gate signal lines 602 for driving display area 610 according to various embodiments. The signal lines 602 can have similar structures to conductive traces 102 of FIG. 1. The display area 610 can include multiple gate lines 635 in display pixels to drive the pixels to display graphics and/or text information. Each gate signal line 602 can transmit a gate signal from display driver 630 to drive the pixels. Here, the gate signal lines 602 can form in the border area 620 on one side of the display area 610. This border routing can optimize border area space as well as reduce the signal lines' resistance.

Figure 7:
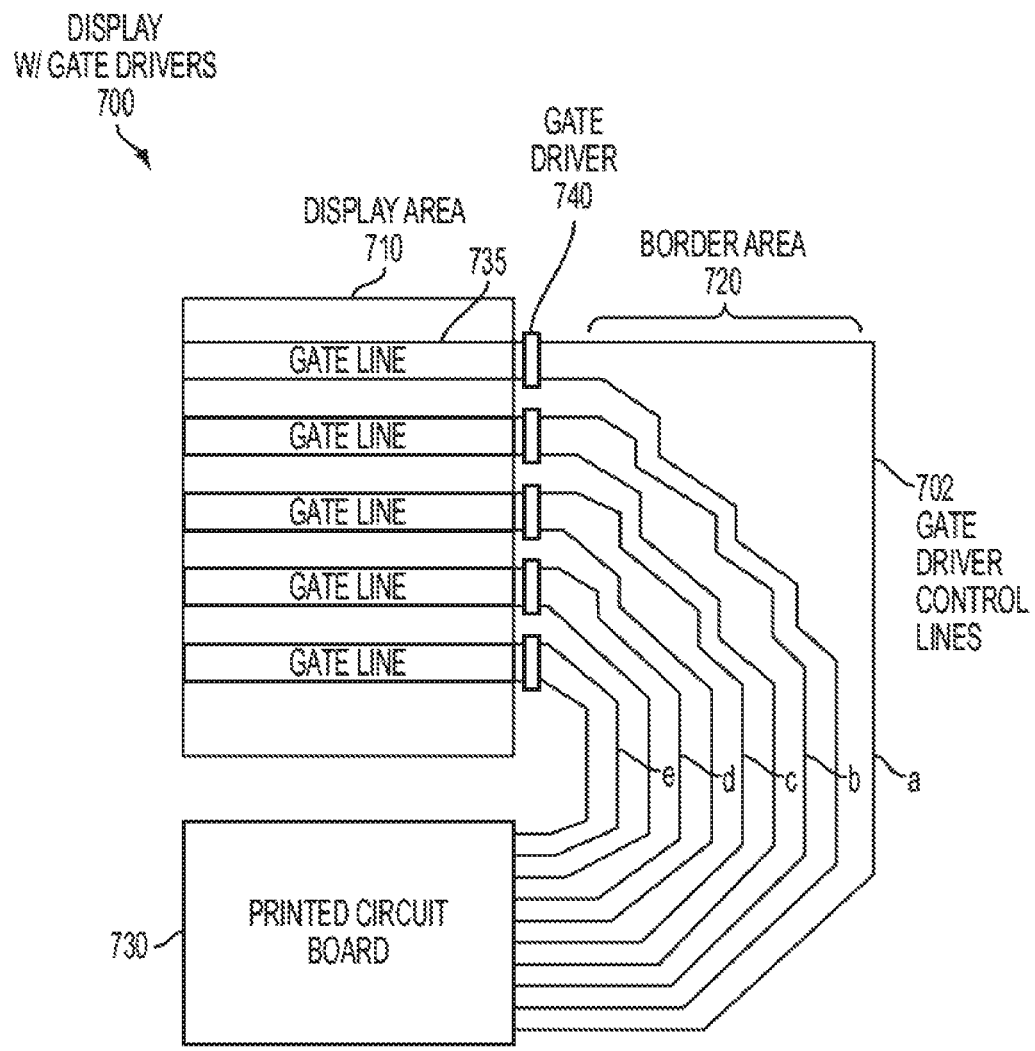
FIG. 7 illustrates an exemplary display with gate drivers having border routing of gate driver control lines according to various embodiments.

In the example of FIG. 7, display 700 can have border routing of gate driver control lines 702 for driving gate drivers 740 according to various embodiments. The control lines 702 can have similar structures to conductive traces 102 of FIG. 1. The gate drivers 740 can drive gate lines 735 in display pixels to drive the pixels to display graphics and/or text information. Each gate driver 740 can be coupled to a corresponding gate line 735. Printed circuit board (PCB)

730 can transmit signals along control lines 702 to control the gate drivers 740 according to the display requirements. Here, the control lines 702 can form in the border area 720 on one side of the display area 710. This border routing can optimize border area space as well as reduce the control lines' resistance.

It is to be understood that border routing is not limited to the devices of FIG. 3 through 7, but can include any devices having border area space constraints and/or conductive trace resistance needs according to various embodiments.

Figure 8:
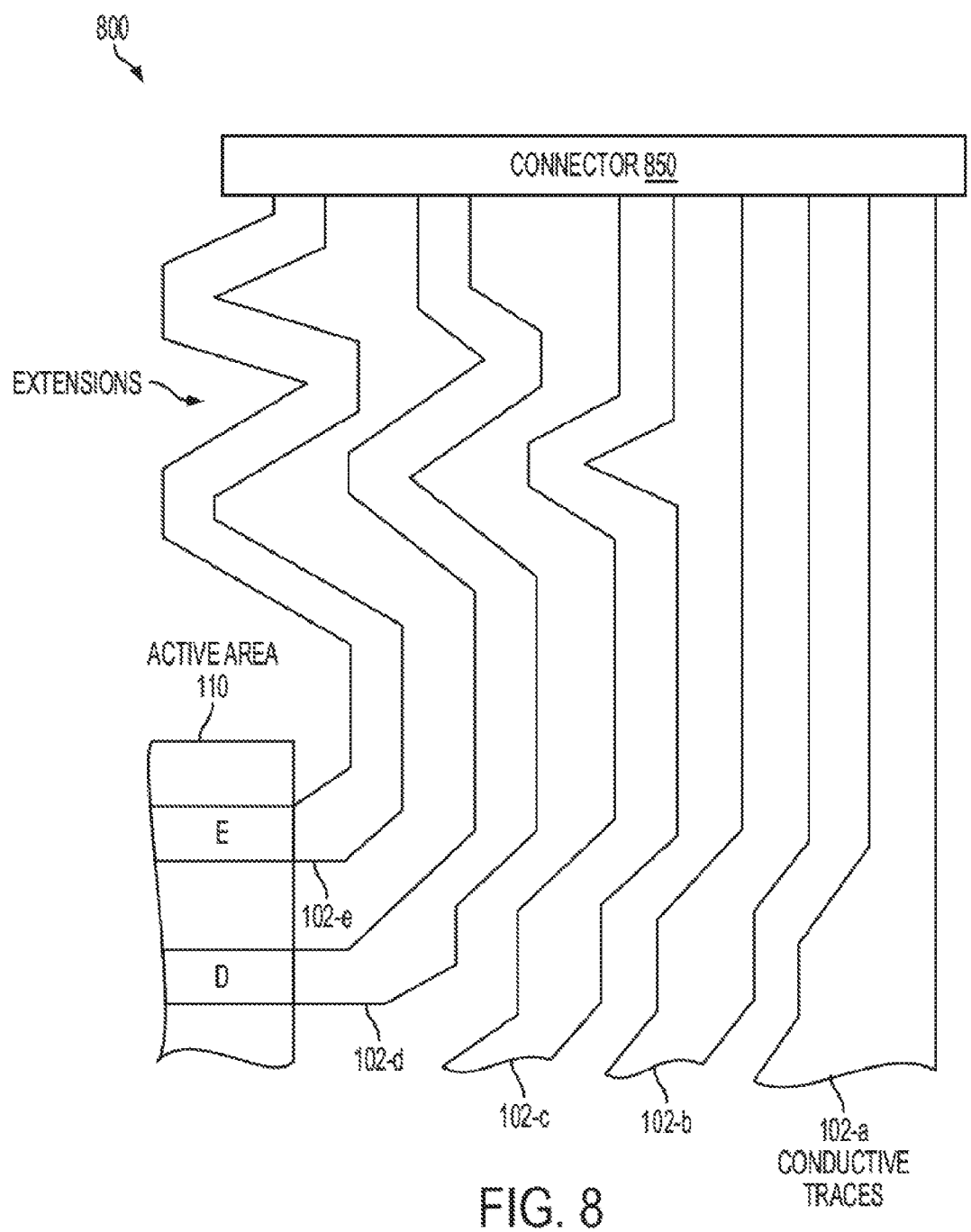
FIG. 8 illustrates an exemplary border routing of the conductive traces of FIG. 1 with extended distal ends according to various embodiments.

As described previously, trace resistance can be a function of trace length, where the longer the trace, the higher the resistance. In FIG. 1, the disparity between the lengths of conductive traces 102-*e* and 102-*a* is significant such that it can be difficult to substantially match the resistances of the two traces (if indeed such a match is an electrical requirement of the device). FIG. 8 illustrates a close up view of an exemplary border routing of the conductive traces of FIG. 1 that addresses this issue. In the example of FIG. 8, conductive trace 102-*e* can have extra length (extensions to the traces having one or more bends) in the border area above the active area 110 to increase its length and thereby its resistance closer to that of the other traces. Conductive traces 102-*d* and 102-*c*, the next shorter traces, can similarly have extra length (though not as much as trace 102-*e*) in the border area above the active area 110 to increase its resistance closer to that of the other traces. Conductive traces 102-*a* and 102-*b*, the longer traces, can omit extra length since their resistance can more likely be the highest of the traces. Connector 850 can connect the traces 102 to signal processing circuitry (not shown).

Figure 9A:
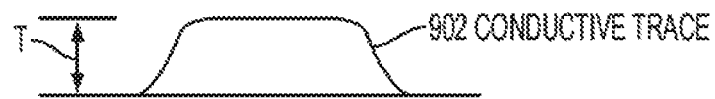
FIGS. 9a through 9c illustrate exemplary stackups of conductive traces that can have border routing according to various embodiments.
Figure 9B:
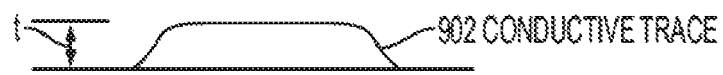
Figure 9C:
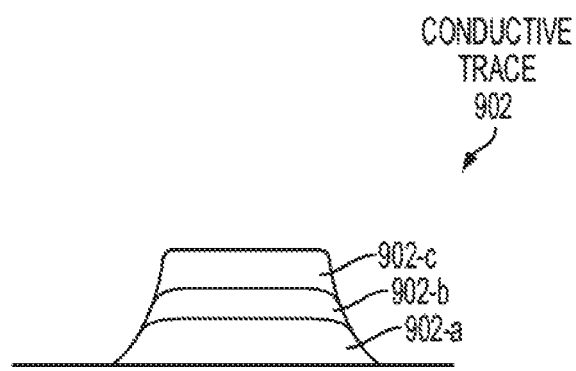

FIGS. 9*a* through 9*c* illustrate exemplary stackups of conductive traces that can have border routing according to various embodiments. The thickness and material makeup of the conductive traces can be varied to meet the electrical requirements of the device. In the example of FIG. 9*a*, a single layer of conductive material having a thickness T can be used, for example, for shorter traces to match longer traces' resistance. In the example of FIG. 9*b*, a single layer of conductive material having a thickness t can be used, for example, for longer traces to reduce the traces' resistance. Alternatively, a single layer of material with higher resistivity can be used in some instances and a single layer of material with lower resistivity can be used in other instance. In the example of FIG. 9*c*, a multi-layer stackup having different materials having higher resistivity, lower resistivity, or both can be used as an alternative to adjusting the thickness of the trace. Example trace materials include Molybdenum/Niobium (Mo/Nb), which has higher resistivity, and Aluminum/Neodymium (Al/Nd), which has lower resistivity.

Figure 10:
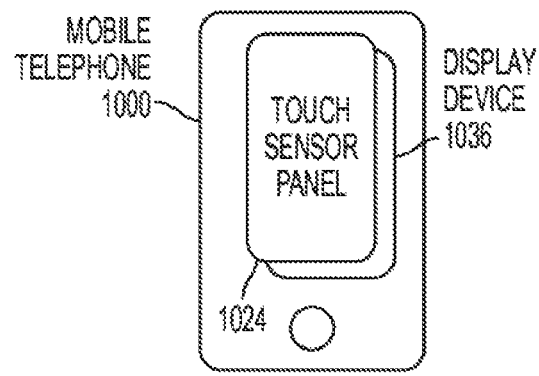
FIG. 10 illustrates an exemplary mobile telephone having a display that includes border routing of conductive traces according to various embodiments.

FIG. 10 illustrates exemplary mobile telephone 1000 that can include touch sensor panel 1024 and display device 1036, the touch sensor panel and/or the display device including conductive traces formed in their border areas according to various embodiments.

Figure 11:
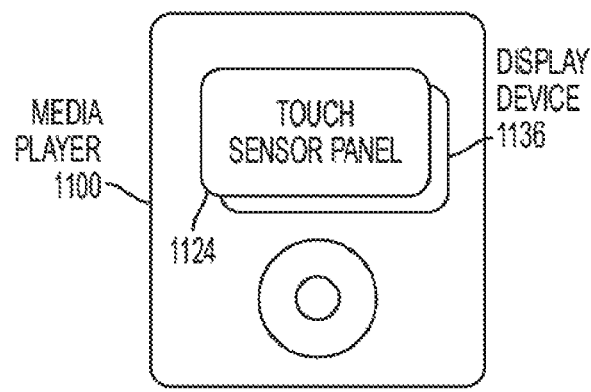
FIG. 11 illustrates an exemplary digital media player having a display that includes border routing of conductive traces according to various embodiments.

FIG. 11 illustrates exemplary digital media player 1100 that can include touch sensor panel 1124 and display device 1136, the touch sensor panel and/or the display device including conductive traces formed in their border areas according to various embodiments.

Figure 12:
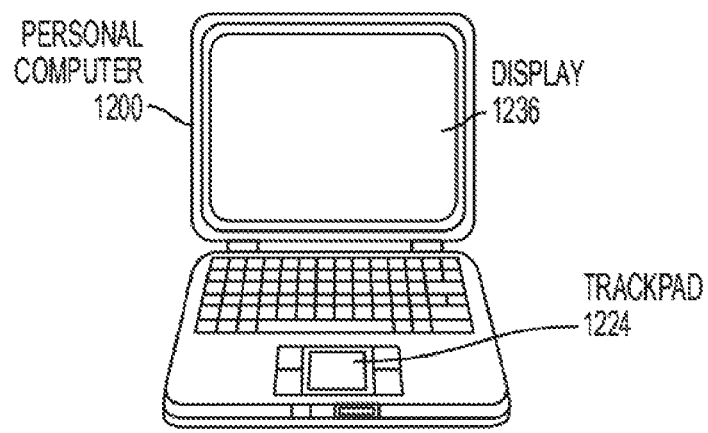
FIG. 12 illustrates an exemplary personal computer having a display that includes border routing of conductive traces according to various embodiments.

FIG. 12 illustrates exemplary personal computer 1200 that can include trackpad 1224 and display 1236, the trackpad and/or the display including conductive traces formed in their border areas according to various embodiments.

The mobile telephone, media player, and personal computer of FIGS. 10 through 12 can be more compact and have improved performance with conductive trace border routing according to various embodiments.

Although embodiments have been fully described with reference to the accompanying drawings, it is to be noted that various changes and modifications will become apparent to those skilled in the art. Such changes and modifications are to be understood as being included within the scope of the various embodiments as defined by the appended claims.

What is claimed is:

1. A display comprising:
an active area configured to display data;
a border area located outside of the active area, the border area including a first region and a second region;
a plurality of rows in the active area, each row forming at least a portion of one or more display pixels;
a connector in the second region of the border area; and
multiple routing traces in a plane disposed along a length of the plane, each routing trace electrically connected to one of the plurality of rows in the first region and configured to route a signal from the one of the plurality of rows to the connector,
the multiple routing traces including:
first and second routing traces located in the first and second regions, the first routing trace located closer to the active area than the second routing trace,
wherein the first routing trace includes one or more bends in the second region,
wherein a number of bends of the first routing trace in the second region is greater than a number of bends of other routing traces in the second region.

2. The display of claim 1, wherein resistances of the multiple routing traces match.

3. The display of claim 1, wherein the one or more bends of the first routing trace include sections with greater slope than one or more bends of the second routing trace.

4. The display of claim 3, wherein one of the multiple routing traces is located adjacent to and has one less bend than the first routing trace in the second region.

5. The display of claim 1, wherein a number of bends of the multiple routing traces decreases from the first routing trace to the second routing trace.

6. The display of claim 1, wherein the second routing trace has no bends in the second region.

7. The display of claim 1, wherein a length of the first routing trace in the second region is greater than a length of an adjacent routing trace in the second region.

8. The display of claim 1, wherein lengths of the multiple routing traces decrease from the first routing trace to the second routing trace.

9. The display of claim 1, wherein at least one bend of the first routing trace borders a third region, included in the second region, and further wherein at least a portion of a bend of an adjacent routing trace is located in the third region.

10. The display of claim 1, wherein each bend includes two straight sections intersecting at non-orthogonal angles.

11. The display of claim 1, wherein the first routing trace includes a first bend and a second bend, the second bend located closer to the connector and including a smaller angle than the first bend.

12. A touch sensor panel comprising:
an active area configured to display data;
a border area located outside of the active area, the border area including a first region and a second region;
multiple rows of touch pixels in the active area and configured to sense a touch or hover;

a connector in the first region of the border area; and
multiple routing traces in a plane disposed along a length of the plane, each routing trace electrically connected to one of the multiple rows of touch pixels in the first region and configured to route a signal from the one of the plurality of rows to the connector,
the multiple routing traces including:
first and second routing traces located in the first and second regions, the first routing trace located closer to the active area than the second routing trace,
wherein the first routing trace includes one or more bends in the second region,
wherein a number of bends of the first routing trace in the second region is greater than a number of bends of other routing traces in the second region.

13. The touch sensor panel of claim 12, wherein the one or more bends of the first routing trace include sections with greater slope than one or more bends of the second routing trace.

14. The touch sensor panel of claim 12, wherein the second routing trace has no bends in the second region.

15. The touch sensor panel of claim 12, wherein a length of the first routing trace in the second region is greater than a length of an adjacent routing trace in the second region.

16. The touch sensor panel of claim 12, wherein the first routing trace includes a first bend and a second bend, the second bend located closer to the connector and including a smaller angle than the first bend.

17. The touch sensor panel of claim 12, wherein the multiple routing traces are coupled to both sides of the touch sensor panel to drive the touch sensor panel from both sides to cause the touch sensor panel to sense the touch or hover.

18. A method of routing conductive traces in a border area of a device, the method comprising:
routing the conductive traces in a plane disposed along a length of the plane, each routing trace electrically connected to one or more touch pixels in a first region of the border area and configured to route a signal from the one or more touch pixels to the connector, the connector located in a second region of the border area,
the routing comprising:
locating first and second conductive traces in the first and second regions of the border area,
creating one or more bends in the first conductive traces in the second region of the border area, wherein a number of bends of the first routing trace in the second region is greater than a number of bends of other routing traces in the second region, and
locating the first conductive trace closer to an active area of the device than the second conductive trace.

19. The method of claim 18, further comprising:
creating one or more bends in the second conductive trace.

20. The method of claim 18, further comprising:
creating one or more straight conductive traces; and
locating the first routing trace closer to the active area of the device than the one or more straight conductive traces.

* * * * *